United States Patent [19]

Chung et al.

[11] Patent Number: 5,000,795

[45] Date of Patent: Mar. 19, 1991

[54] SEMICONDUCTOR WAFER CLEANING METHOD AND APPARATUS

[75] Inventors: Bryan C. Chung, Flemington; Roland Ellis, Jr., Burlington Township, Burlington County, both of N.J.; Kenneth G. Frazee, Winter Springs, Fla.

[73] Assignee: AT&T Bell Laboratories, Murray Hill, N.J.

[21] Appl. No.: 367,085

[22] Filed: Jun. 16, 1989

[51] Int. Cl.$^5$ .......................... B08B 3/02; B08B 3/08; B08B 5/00
[52] U.S. Cl. ......................................... 134/37; 134/2; 134/3; 134/25.4; 134/102
[58] Field of Search ...................... 134/102, 2, 3, 25.4, 134/37

[56] References Cited

U.S. PATENT DOCUMENTS

| | | | |
|---|---|---|---|
| 4,209,342 | 6/1980 | Workman | 134/102 |
| 4,458,703 | 7/1984 | Inoue | 134/57 R |
| 4,577,650 | 3/1986 | McConnell | 134/102 |
| 4,778,532 | 10/1988 | McConnell et al. | 134/10 |

FOREIGN PATENT DOCUMENTS

| | | | |
|---|---|---|---|
| 0100433 | 6/1983 | Japan | 134/3 |
| 0132934 | 8/1983 | Japan | 134/3 |
| 2210132 | 1/1989 | United Kingdom | 134/25.4 |

Primary Examiner—Olik Chaudhuri
Assistant Examiner—Ourmazd S. Ojan
Attorney, Agent, or Firm—R. B. Anderson

[57] ABSTRACT

A reagent chemical is directed along a first pipe portion (20) that extends along one side of the array of wafers (14) and which contains a plurality of jets (33) for projecting the chemical toward the wafers. A plurality of second pipe portions (21) transmits an inert gas, with each pipe portion having a plurality of jets (34) for projecting the gas toward the floor of the tank.

5 Claims, 4 Drawing Sheets

SEMICONDUCTOR WAFER CLEANING METHOD AND APPARATUS

TECHNICAL FIELD

This invention relates to semiconductor cleaning and, more particularly, to semiconductor cleaning through agitation of a reagent chemical in an acid solution.

BACKGROUND OF THE INVENTION

The increased circuit densities defined in semiconductor chips has increased the need for more effective cleaning of the semiconductor wafers from which the clips are made. A widely-used method for cleaning silicon semiconductor wafers is the use of a hot acid bath, such as sulfuric acid, into which a reagent chemical such as hydrogen peroxide, has been added. Because the sulfuric acid is highly reactive, conventional plumbing and agitation apparatus cannot be used within the cleaning bath. Thus, it is common to use a magnetic stirrer for agitating the bath and a chemical dispense head for introducing the hydrogen peroxide into the bath. The magnetic stirrer comprises an elongated ferromagnetic element coated with TEFLON (a trademark for a synthetic resin polymer) that is introduced into the bath; another ferromagnetic element outside the bath is rotated by a conventional motor which causes rotation of the magnetic stirrer in the bath to promote agitation, as is required for removal of reacted contaminants from the wafer surfaces. The chemical dispense head, which is not immersed in the bath, and can therefore be made of conventional materials, typically comprises a pipe with several nozzles for projecting the hydrogen peroxide onto the upper surface of the sulfuric acid bath. Magnetic stirrers and chemical dispense heads as described are commercially available from the Modutek Company, 960 Remillard Court, San Jose, Calif. This system must be operated with care because the highly reactive cleaning chemicals can injure the operators.

There has been for some time a recognized need for a more effective cleaning method than that provided by the conventional system. The U.S. patent of McConnell et al., U.S. Pat. No. 4,778,532, issued Oct. 18, 1988, is an example of relatively expensive and cumbersome apparatus for cleaning semiconductor wafers more effectively. There is therefore still a need for relatively safe, inexpensive and convenient methods and apparatus for more dependably and more thoroughly cleaning semiconductor wafers.

SUMMARY OF THE INVENTION

These problems are solved by the use, in an acid cleaning tank, of an array of pipes made from a TEFLON member supported on the floor of the tank which in turn supports the array of semiconductor wafers being cleaned. A reagent chemical is directed along a first pipe portion that extends along one side of the array of wafers and which contains a plurality of jets for projecting the chemical toward the wafers. The remainder of the pipes constitute a plurality of second pipe portions for transmitting an inert gas, each pipe portion having a plurality of jets for projecting the inert gas into the cleaning fluid. It has been found that projecting the inert gas toward the floor of the tank creates a highly active bubbling condition within the tank which, together with the reagent chemical injection, provides sufficient agitation to improve significantly the removal of impurities from the surfaces of the wafers.

These and other objects features and advantages of the invention will be better understood from a consideration of the following detailed description taken in conjunction with the accompanying drawing.

DETAILED DESCRIPTION

Figure 1:
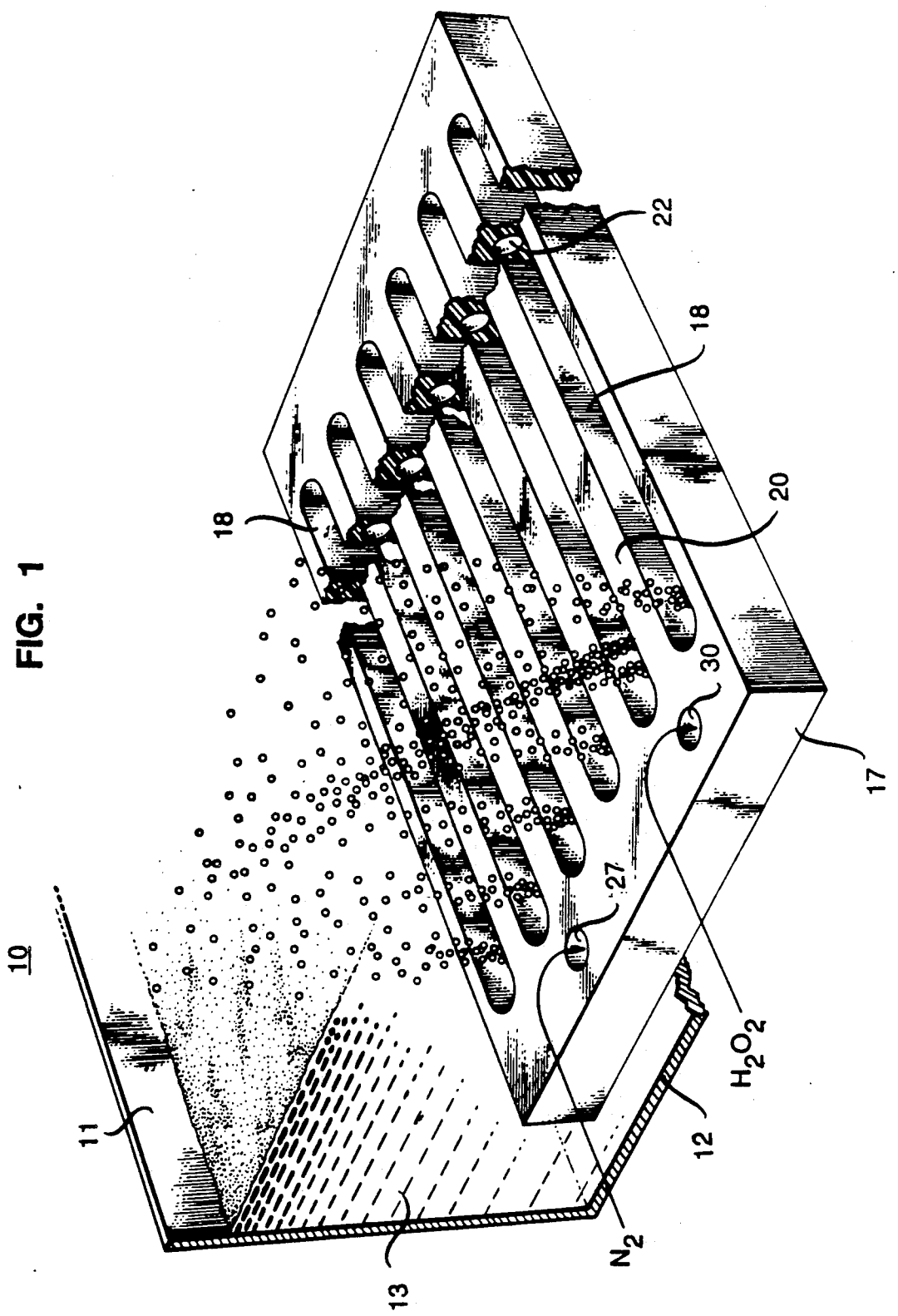
FIG. 1 is a partially schematic perspective view illustrating an improved reagent chemical injection and bubbler agitation method and apparatus in a semiconductor wafer cleaning tank in accordance with an illustrative embodiment of the invention.
Figure 2:
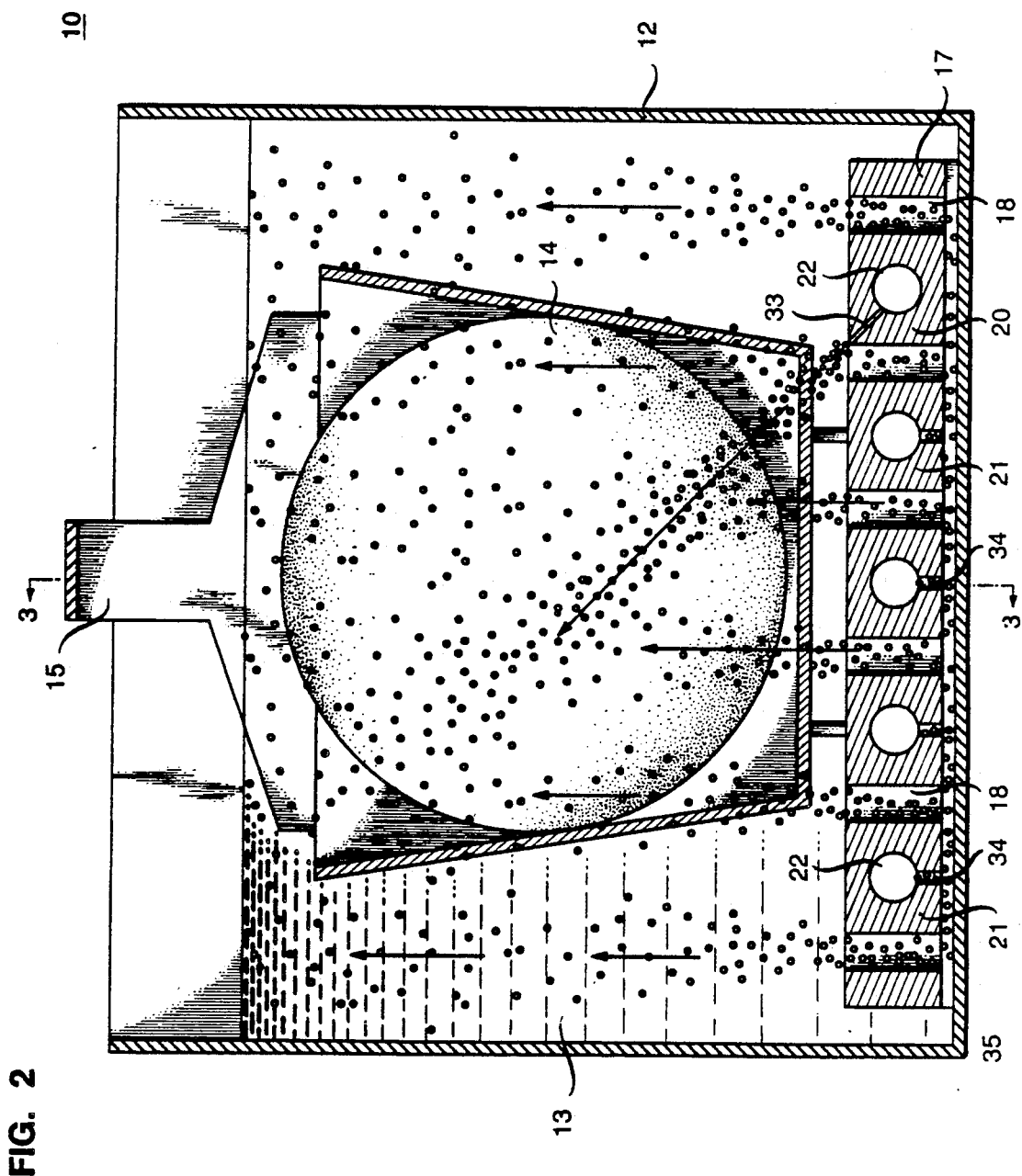
FIG. 2 is a front view of a semiconductor wafer cleaning tank in accordance with the embodiment of FIG. 1.
Figure 3:
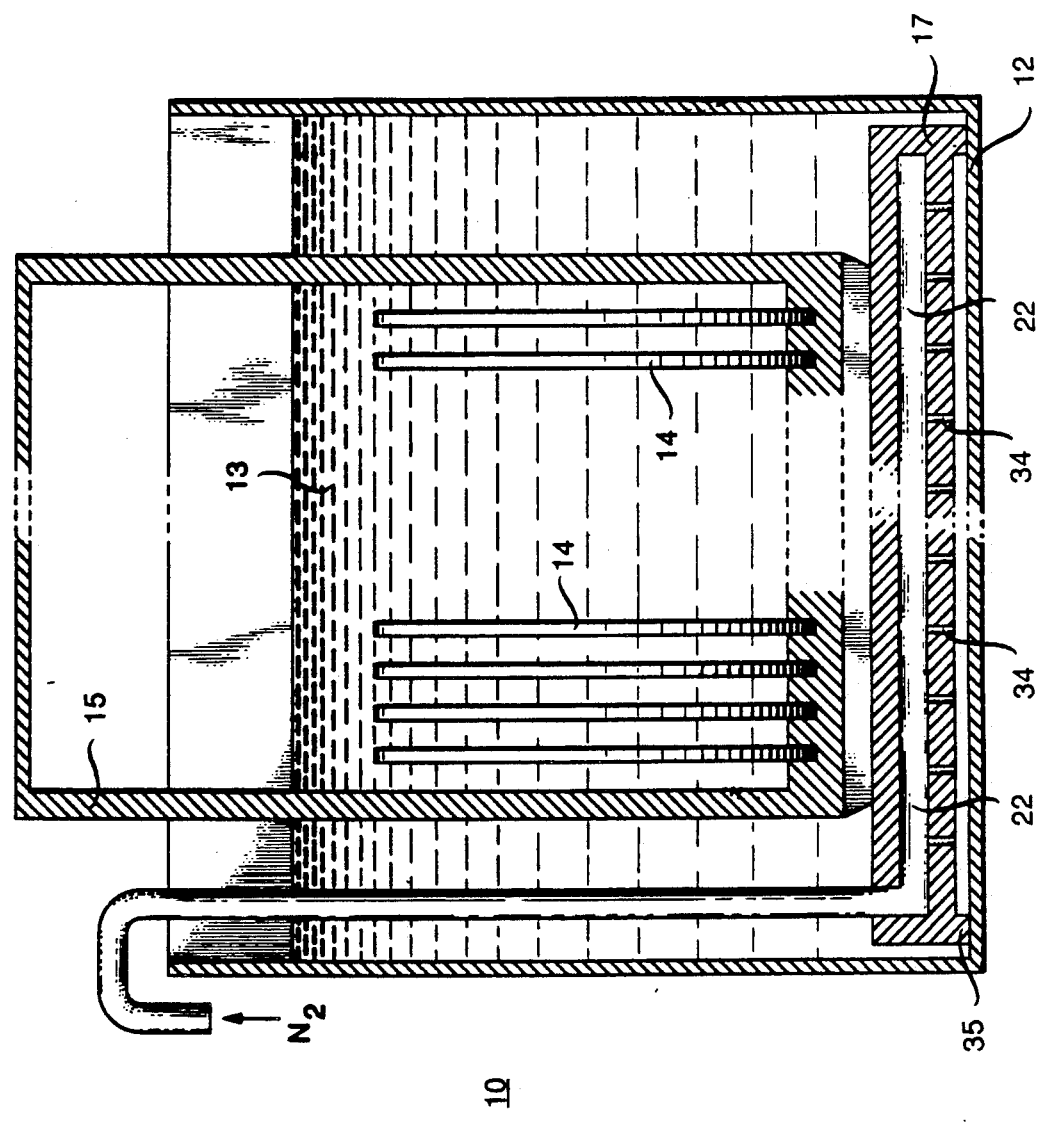
FIG. 3 is a view taken along Lines 3—3 of FIG. 2.

Referring to FIG. 1, there is shown a partially schematic perspective view of apparatus that can be used to obtain improved reagent chemical injection and agitation in a semiconductor wafer tank 10 in accordance with an illustrative embodiment of the invention. The wafer cleaning tank 10 comprises side walls 11 and a floor 12 and contains a highly reactive cleaning fluid 13, preferably hot sulfuric acid. Wafers 14 to be cleaned are shown in FIG. 2, which is a front view of the cleaning tank 10, and FIG. 3, which is a section taken along Lines 3—3 of FIG. 2. For purposes of clarity, the wafers are not shown in FIG. 1. The wafers 14 are maintained in a stacked array by a holder 15 as shown more clearly in FIGS. 2 and 3. It is intended that the wafers of the array be held substantially perpendicularly with respect to the top surface of the cleaning fluid 13, or at least at a large angle with respect to such top surface.

In accordance with the invention, there is located on the floor of the tank 10 an integrated pipe unit 17 having the general shape of a parallelepiped with flat upper and lower surfaces and an array of elongated openings 18 extending therethrough. The purpose of the cleaning tank 10 is to clean the wafers 14 by reacting impurities with the sulfuric acid and an injected reagent chemical such as hydrogen peroxide. For this to be effective, it is important that the reagent chemical be uniformly distributed along the major surfaces of the wafers and that there be sufficient agitation to promote reaction and remove from the wafer surfaces reacted impurities. It is toward achieving these ends that integrated pipe unit 17 was devised.

Figure 4:
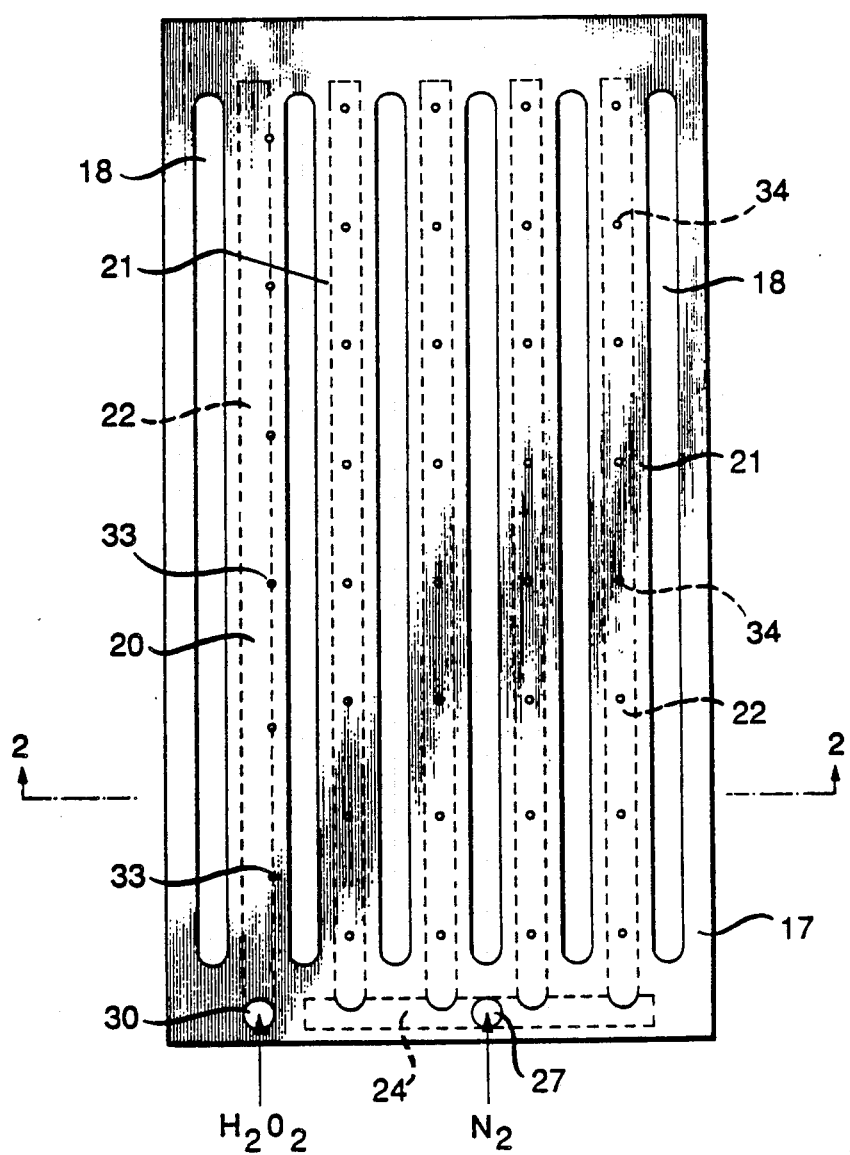
FIG. 4 is a top view of the integrated pipe unit shown in FIG. 1.

As shown more clearly in FIGS. 2 and 4, the openings 18 separate a first pipe portion 20 and a plurality of second pipe portions 21. All of the pipe portions have generally rectangular outer surfaces, and each contains a cylindrical passage 22. As shown more clearly in FIG. 4, the central passage 22 of all of the second pipe portions 21 are connected to an interconnection passage 24 which is in turn connected to an input port 27. The first pipe portion 20 transmits the chemical reagent, hydrogen peroxide ($H_2O_2$), from an input port 30, as schematically shown in FIG. 1. An inert gas such as nitrogen ($N_2$) is introduced into input port 27 and flows along the second pipe portions 21 as shown schematically in FIG. 1.

As best shown in FIGS. 2 and 4, there is included along the length of first pipe portion 20 a plurality of jets 33 interconnecting the central passage 22 with the volume enclosed by the tank 10. The hydrogen peroxide, which is preferably a 30 percent aqueous solution of hydrogen peroxide, is transmitted under pressure through the first pipe portion 20 and therefore is injected through jets 33 at an angle toward the wafers 14. The jets 33 describe an angle of 45° with respect to the horizontal, as shown in FIG. 2. This angle may be any angle between 45° and 60° with respect to the horizontal to ensure contact of the hydrogen peroxide with the major surfaces of the wafers. The jets 33 shown in the figures are only schematic representations. There may be about six such jets located along the length of the first pipe portion 20 for giving the desired dispersal of the reagent chemical.

The injection of the chemical reagent provides some agitation in the cleaning bath, but the major part of the agitation is produced by the inert gas directed through the second pipe portions 21. Located along each of the pipe portions 21 is an array of jets 34 best shown in FIGS. 2 and 3. Located on the four corners of the integrated pipe unit 17 are spacer pads 35 best shown in FIGS. 2 and 3. As a consequence, the lower surface of the integrated pipe unit 17 is spaced from the floor 12 of the tank so that the jets 34 communicate between the central passage of second pipe portions 22 and the volume enclosed by tank 10. This permits gas to be bubbled through openings 18 so that the bubbles pass in close proximity to wafers 14, and provide thorough agitation of the entirety of the liquid cleaning bath, and especially the part of the bath adjacent the wafers.

In one embodiment of the invention that was made, the integrated pipe unit 17 was entirely made of TEFLON which, as is known, is a non-reactive material that is not affected by the acid cleaning bath or the hydrogen peroxide. The length of the unit (in a direction parallel with the elongated openings 18) was 15.00 inches, its width 7.00 inches and its height 1.00 inch. Each of the openings 18 was 12.62 inches long. The pipe portions were 0.44 inches in diameter with 1.17 inches center-to-center spacing. The height of spacers 35 was 0.05 inch. The generally flat configuration of the unit 17 permitted a conventional basket-type holder 15 for the wafers 14 to be rested on it. The wafers were 5-inch diameter silicon wafers which were cleaned with sulfuric acid and a 30 percent aqueous solution of hyrogen peroxide reagent. Eight jets were included along each pipe portion with each jet having a diameter of 0.007–0.062 inches. Other workable embodiments have been made with as many as eighty jets along each pipe portion.

The integrated pipe unit was made from a single flat TEFLON workpiece. The pipe passages 22 and 24 were made by drilling through the entirety of the workpiece and thereafter inserting TEFLON plugs to block off the end portions, that is, when originally drilled, each passage 22 extended the entire length of unit 17 and each passage 24 extended the entire width of the second pipe portion. Thereafter, threaded cylindrical plugs (not shown) were permanently inserted to yield the integrated pipe unit 17 shown. The gaseous $N_2$, at a pressure of 2 psi, and liquid $H_2O_2$ solution, at a pressure of 2.5 psi, were transmitted to the integrated pipe unit by TEFLON pipes 37 shown only in FIG. 3, for the sake of clarity.

One can appreciate that the apparatus and method of our invention is extremely simple and unexpensive, and yet our tests show significant improvements in cleaning over conventional systems using a magnetic stirrer and chemical dispense head. Moreover, our system offers advantages of safety because the hydrogen peroxide is injected within the acid bath, rather than upon its upper surface.

Various modifications and embodiments of the invention other than those explicitly described above may be made by those skilled in the art without departing from the spirit and scope of the invention. For example, phosphoric acid may be used in place of sulfuric acid, as is known.

We claim:

1. A method for cleaning semiconductor wafers comprising:
    locating at the bottom of an acid tank a first pipe portion and a plurality of second pipe portions;
    the first and second pipe portions being integrated into a single pipe unit made of teflon and each pipe portion containing an array of axially spaced openings;
    locating on the pipe unit an array of wafers to be cleaned;
    immersing the array of wafers and the pipe unit in an acid selected from the group consisting of sulfuric acid and phosphoric acid;
    agitating the acid by directing a non-reactant gas through the plurality of second pipe portions such that the gas is projected through the axially spaced openings of the second pipe portions into the acid to form bubbles in the acid;
    directing a cleaning reagent comprising a hydrogen peroxide solution against the wafer array comprising the step of directing the hydrogen peroxide solution into the first pipe portions such that it is projected through the axially spaced openings of the first pipe portion toward the wafer array.

2. The method of claim 1 further characterized in that:
    an outer surface of the plurality of second pipe portions is displaced a small distance from the floor surface of the tank and the inert gas is projected from the second pipe portions toward the floor.

3. The method of claim 2 further characterized in that:
    the first pipe portion is displaced to one side of the wafer and the reagent chemical is projected from the first pipe portion at an angle toward the wafers.

4. Apparatus for assisting in the cleaning of semiconductor wafers comprising:
    an integrated teflon pipe unit having the general shape of a flat parallelepiped that is much smaller in height than in its length and width dimensions;
    the integrated pipe unit adapted tp be supported on the floor of a cleaning tank and to support on its upper surface an array of semiconductor wafers to be cleaned;
    said cleaning tank containing an acid selected from the group consisting of sulfuric acid and phosphoric acid;
    a plurality of spacers on the bottom surfaces of the integrated unit for creating a predetermined space between the floor of the tank and the bottom surface of the integrated unit;
    a plurality of elongated openings extending through the upper and lower surfaces of the integrated unit, the openings being separated by a plurality of pipe portions, each having a generally rectangular outer cross-sectional surface;

a first one of the pipe portions being adapted to transmit a liquid hydrogen peroxide reagent chemical and having spaced therealong a plurality of jets extending in an angled upward direction and being adapted to inject into the tank the liquid reagent chemical during operation;

the remaining second pipe portions each having an interior passage, each of which is connected at one end to an interconnection passage;

the interconnection passage being connected to an input port for transmitting an inert gas under pressure through each of the second pipe portion passages;

and a plurality of jets extending from each passage of each second pipe portion in a generally downward direction.

5. The apparatus of claim 4 wherein:

the first pipe portion extends along one side of the integrated pipe unit and is adapted to project the reagent chemical at an angle of between 45° and 60° with respect to the horizontal.

* * * * *